(12) United States Patent
Rachmady et al.

(10) Patent No.: US 10,665,688 B2
(45) Date of Patent: May 26, 2020

(54) LOW SCHOTTKY BARRIER CONTACT STRUCTURE FOR GE NMOS

(71) Applicant: Intel Corporation, Santa Clara, CA (US)

(72) Inventors: Willy Rachmady, Beaverton, OR (US); Matthew V. Metz, Portland, OR (US); Benjamin Chu-Kung, Portland, OR (US); Van H. Le, Portland, OR (US); Gilbert Dewey, Hillsboro, OR (US); Ashish Agrawal, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,894

(22) PCT Filed: Dec. 24, 2015

(86) PCT No.: PCT/US2015/000362
§ 371 (c)(1),
(2) Date: May 4, 2018

(87) PCT Pub. No.: WO2017/111810
PCT Pub. Date: Jun. 29, 2017

(65) Prior Publication Data
US 2018/0331195 A1  Nov. 15, 2018

(51) Int. Cl.
*H01L 29/47* (2006.01)
*H01L 21/28* (2006.01)
(Continued)

(52) U.S. Cl.
CPC ........ *H01L 29/47* (2013.01); *H01L 21/28255* (2013.01); *H01L 29/45* (2013.01); *H01L 29/66477* (2013.01); *H01L 29/78* (2013.01)

(58) Field of Classification Search
CPC .......... H01L 23/49524; H01L 23/3107; H01L 23/49548; H01L 23/49575; H01L 29/47; H01L 29/45; H01L 29/66477; H01L 29/78
See application file for complete search history.

(56) References Cited

U.S. PATENT DOCUMENTS

2007/0187767 A1    8/2007  Yasutake
2010/0155790 A1*  6/2010  Lin ................... H01L 21/28255
                                                                  257/288

(Continued)

OTHER PUBLICATIONS

N. Cheung "IC Process Integration," ee143 fall 2010 Berkeley (Year: 2010).*

(Continued)

*Primary Examiner* — Matthew L Reames
(74) *Attorney, Agent, or Firm* — Schwabe, Williamson & Wyatt P.C.

(57) ABSTRACT

An apparatus including a substrate; a transistor device on the substrate including a channel and a source and a drain disposed between the channel; a source contact coupled to the source and a drain contact coupled to the drain; and the source and drain each including a composition including a concentration of germanium at an interface with the channel that is greater than a concentration of germanium at a junction with the source contact. A method including defining an area on a substrate for a transistor device; forming a source and a drain each including an interface with the channel; and forming a contact to one of the source and the drain, wherein a composition of each of the source and the drain includes a concentration of germanium at an interface with the channel that is greater than a concentration at a junction with the contact.

17 Claims, 8 Drawing Sheets

(51) Int. Cl.
*H01L 29/66* (2006.01)
*H01L 29/78* (2006.01)
*H01L 29/45* (2006.01)

(56) References Cited

U.S. PATENT DOCUMENTS

| | | |
|---|---|---|
| 2012/0037998 A1 | 2/2012 | Bedell et al. |
| 2012/0319203 A1 | 12/2012 | Cheng et al. |
| 2015/0048417 A1 | 2/2015 | Kwok et al. |
| 2015/0179795 A1 | 6/2015 | Kim et al. |
| 2015/0228724 A1 | 8/2015 | Kwok |

OTHER PUBLICATIONS

International Preliminary Report on Patentablity for International Patent Application No. PCT/US2015/000362, dated Jul. 5, 2018, 9 pages.
International Search Report and Written Opinion for International Patent Application No. PCT/US2015/000362 dated Aug. 31, 2016, 12 pgs.
Office Action from Taiwan Patent Application No. 105138703, dated Feb. 24, 2020, 12 pages.

\* cited by examiner

LOW SCHOTTKY BARRIER CONTACT STRUCTURE FOR GE NMOS

CROSS-REFERENCE TO RELATED APPLICATION

This patent application is a U.S. National Phase Application under 35 U.S.C. § 371 of International Application No. PCT/US2015/000362, filed Dec. 24, 2015, entitled "LOW SCHOTTKY BARRIER CONTACT STRUCTURE FOR GE NMOS," which designates the United States of America, the entire disclosure of which is hereby incorporated by reference in its entirety and for all purposes.

BACKGROUND

Field

Integrated circuit devices.

Description of Related Art

High access resistance has been one of the limiters for realizing high performance germanium (Ge) NMOS devices. One contributor to the high access resistance is the high Schottky barrier height (SBH) of metal/n+Ge contact. The Fermi level tends to be pinned near the valence band for most metals/Ge contacts. Such pinning is beneficial for PMOS devices but a disadvantage for NMOS devices. In addition, it is generally more difficult to achieve high n-type dopant concentration in germanium and then in silicon.

DETAILED DESCRIPTION

Techniques to reduce access resistance in transistor devices are described. In one embodiment, access resistance is reduced for germanium devices through the reducing of a concentration of germanium at junctions with metal contacts, such as interfaces between a contact and source or drain material.

Figure 1:
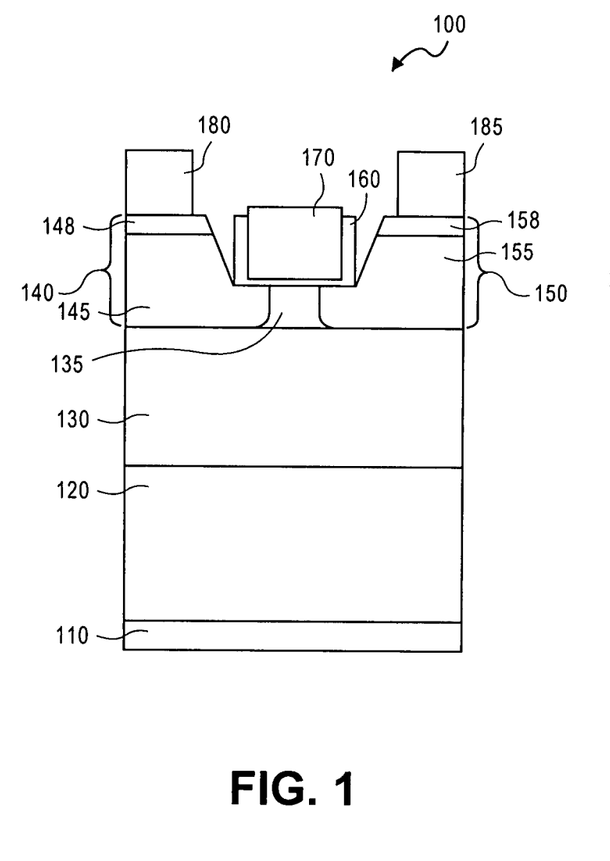
FIG. 1 shows a cross-sectional schematic side view of an embodiment of a field effect transistor (FET) device including a multilayer source and drain.

FIG. 1 shows a cross-sectional side view of an embodiment of a field effect transistor (FET) device. Referring to FIG. 1, device 100 includes substrate 110 that is, for example, a single crystal silicon substrate. Disposed on substrate 110, in this embodiment, is buffer layer 120. Buffer layer 120 contains, for example, a material that has a larger lattice than a material of the substrate (e.g., wherein substrate 110 is monocrystalline silicon, buffer layer 120 has a larger lattice constant than silicon). One suitable material for buffer layer is germanium. To reduce a threading dislocation density, a material such as germanium may be graded in buffer layer 120 to gradually increase a germanium composition in an epitaxially grown silicon germanium film such that closer to substrate 110, the germanium concentration is less and increases away from the substrate.

Figure 2:
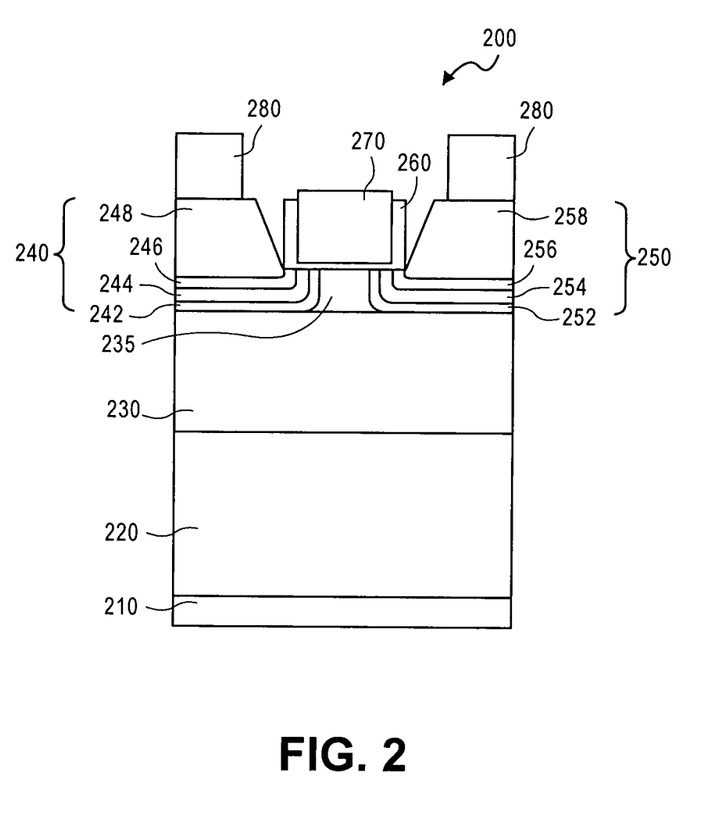
FIG. 2 shows a cross-sectional side view of another embodiment of a FET device including a source and drain graded composite composition.

In the embodiment in FIG. 1 and FIG. 2, disposed on buffer layer 120 is blocking layer 130. In one embodiment, blocking layer 130 is a blocking material of a wide bandgap material (e.g., a material having a bandgap on the order of at least one electron volts (eV)) that has a lattice structure similar to a lattice of buffer layer 120 at the interface. For a buffer layer of primarily germanium at the interface (buffer layer 120), a suitable wide bandgap material is semi-insulating gallium arsenide (GaAs).

As illustrated in FIG. 1, disposed on blocking layer 130 is junction region or source 140 and junction region or drain 150. In one embodiment, source 140 is an $n^+$ source of an NMOS FET and drain 150 is an $n^+$ drain. Disposed between source 140 and drain 150 is channel 135 of an intrinsic semiconductor material such as germanium. Overlying channel 135 is gate dielectric layer 160 of, for example, a silicon dioxide or a dielectric material having a dielectric constant greater than silicon dioxide (a high k material) or a combination of silicon dioxide and high k material or multiple high k materials. Disposed on gate dielectric 160 is gate electrode 170 of, for example, a metal material (e.g., tungsten, tantalum) or a metal compound (e.g., a silicide). FIG. 1 also shows contact 180 to source 140 and contact 185 to drain 150 each of a metal material such as nickel (Ni), cobalt (Co), titanium (Ti) and their silicides As illustrated in FIG. 1; each of source 140 and drain 150 is a multilayer composition. Source 140 includes first source material 145 and second source material 148 that may be grown or deposited. Drain 150 includes first drain material 155 and second drain material 158. For an NMOS FET, first source material 145 and first drain material 155 are each n-doped germanium. The Schottky barrier height (SBH) of an $n^+$ germanium metal interface is relatively high. To avoid such an interface between metal contacts 180 and 185 to germanium in source 140 and drain 150, respectively, second source material 148 and second drain material 158 is included in source 140 and drain 150 between the respective contact and first source material 145 and first drain material 155. Second source material 148 and second drain material 158 are selected to be a material or materials having a Schottky barrier relative to a conduction band of a material of contacts 180 and 185 that is lower than a Schottky barrier of germanium relative to the conduction band. One material is silicon. In one embodiment, a silicon material may be epitaxially grown or deposited (e.g., chemical vapor deposition (CVD)) on first source material 145 and first drain material 155 to form second source material 148 and second drain material 158. In one embodiment, second source material 148 and second drain material 158 of silicon is grown or deposited to a thickness sufficient to dictate electrical properties (e.g., a bandgap) relative to first source material 145 and first drain material 155 with respect to contact 180 and contact 185, respectively, but thin enough not to change a physical property of first source material 145 or first drain material 155 (e.g., a strain of the material). A representative thickness of second source material 148 and second drain material 158 as an interfacial layer is on the order of 4 nanometers (nm) to 5 nm.

For an NMOS FET, a silicon material of second source material 148 and second drain material 158 is doped with n-type dopants such as arsenic and phosphorous. In one embodiment, second source material 148 and second drain material 158 are doped to a higher dopant concentration than a dopant concentration of first material 145 and first drain material 155. Since a silicon material can be doped to a higher dopant concentration than a germanium material, a spreading resistance of the device may be reduced relative to a device having only a source and drain of only germanium by a high dopant concentration in the silicon material of the respective junctions.

FIG. 2 shows a cross-section of another embodiment of a FET device. Referring to FIG. 2, the device includes substrate 210 of a semiconductor material such as single crystal silicon. Disposed on substrate 210 is buffer layer 220 including a concentration of a semiconductor material having a lattice larger than a lattice of substrate 210. In one embodiment, buffer layer 220 is a silicon germanium that includes a graded concentration of germanium similar to that describe with reference to the buffer layer of the embodiment described with reference to FIG. 1. Disposed on buffer layer 220 is blocking layer 230 of, for example, a wide bandgap material such as GaAs.

Disposed on blocking layer 230, blocking material 235 is a FET device including source 240 (e.g., an n+ source) and drain 250 (e.g., a n+ drain). Disposed between source 240 and drain 250 is channel region 235 of an intrinsic semiconductor material such as germanium. Disposed on channel 235 is gate dielectric 260 and gate electrode 270. FIG. 2 also shows contact 280 to source 240 and contact 285 to drain 250 each of a metal material such as Ni, Co, Ti and their silicides.

Referring to source 240 and drain 250 of device 200, each is a composite composition of germanium and a material that has a lower Schottky barrier than germanium relative to a conduction band of contact 280 and contact 285. A representative material is silicon. In the embodiment illustrated in FIG. 2, using germanium and silicon as the materials that make up a composite composition, each composition is graded through the respective source and drain so that a germanium concentration of material of source 240 and drain 250 is greatest (e.g., 100 percent) at an interface with blocking layer 230 and an interface with channel 235 and decreases as the material is separated from the interfaces. Similarly, a silicon concentration is graded through the junction so that a silicon concentration is at its lowest (e.g., 0 percent) at the interface with blocking layer 230 and the interface with channel 235 and is increased from the interfaces toward an apex of the junction or a contact point with contact 280 or contact 285 where its concentration is at its greatest (e.g., 100 percent).

Referring to source 240 of device 200 in FIG. 2, source 240 has a graded junction including portions 242, 244, 246 and 248. Portion 242 of source 240 is disposed at an interface with blocking layer 230 and an interface with channel 235. In one embodiment of an NMOS FET, portion 242 is 100 percent germanium. Portion 244 which is farther from the interfaces than portion 242, has a germanium concentration less than portion 242. Portion 246 being even farther removed from the interfaces has a germanium concentration less than portion 244. Finally, portion 248 being farthest from the interfaces has the least germanium concentration (e.g., 0 percent). While the germanium concentration decreased from portion 242 to portion 248, the silicon concentration increased, for example, from 0 percent to 100 percent. Drain 250 of device 200, in one embodiment, has a similarly formed composite junction. FIG. 2 shows drain 250 including portions 252, 254, 256 and 258. In terms of germanium concentration portion 252 is greatest (e.g., 100 percent) with portion 254 being greater than portion 256 and portion 256 being greater than portion 258 (e.g., 0 percent). In terms of silicon concentration, portion 258 is greatest (100 percent), and such concentration progressively decreases in portions 256, 254 and 252 (0 percent). Similar to device 100 described in reference to FIG. 1, silicon is present in source 240 and drain 250 in an amount and at a location sufficient to dictate electrical properties relative to germanium with respect to contact 280 and contact 285 but its amount and location is insufficient to change a physical property of germanium in the source and drain (e.g., a strain of the material).

Figure 3:
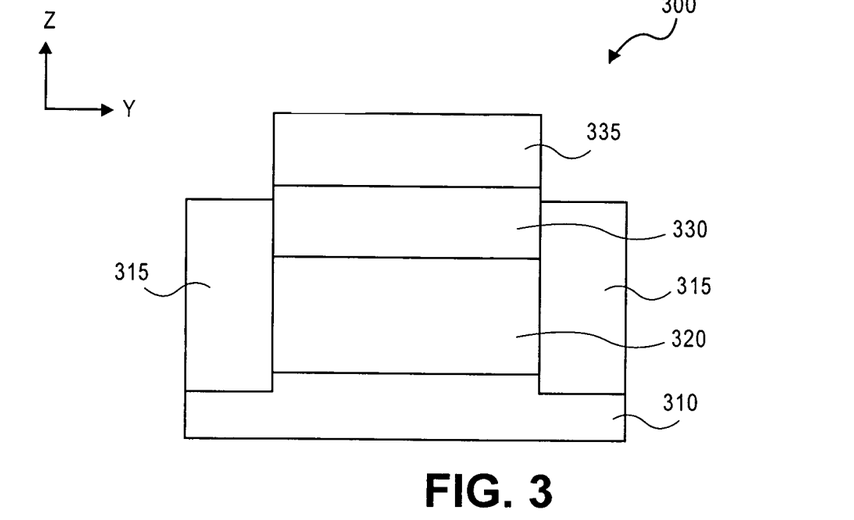
FIG. 3 shows a cross-sectional schematic side view of a semiconductor substrate.

FIGS. 3-7 describe a process for forming an FET such as illustrated in FIG. 1 or FIG. 2. FIG. 8 presents a flow chart of the process. FIGS. 3-7 describe a three-dimensional multi-gate FET including a multilayer or composite source and drain. The concept of a multilayer or composite (graded composite) source and drain can similarly be applied to planar transistor and gate all around transistors. Referring to FIG. 3 and with reference to the flow chart of FIG. 8, the process begins by forming a heterogeneous integrated semiconductor material structure (block 410, FIG. 8). FIG. 3 shows a cross-sectional side view of a heterogeneous integrated semiconductor structure. Substrate 310 as a base of the structure includes any material that may serve as a foundation upon which a multi-gate FET may be constructed. Representatively, substrate 310 is a portion of a larger substrate such as a wafer. In one embodiment, substrate 310 is a semiconductor material such as single crystal silicon. Substrate 310 may be a bulk substrate or, in another embodiment, is a semiconductor on insulator (SOI) structure.

In an embodiment involving non-lattice matched materials, bulk semiconductor substrates allow for implementation of high quality device layers. Disposed on a surface of substrate 310 in FIG. 3 is buffer layer 320. In one embodiment, buffer layer 320 includes a semiconductor material including a concentration of a semiconductor material such as germanium or a group III-V compound material compositionally graded through the layer. In an embodiment where buffer layer 320 includes germanium, a germanium concentration is increased from an interface of the layer with semiconductor substrate 310 toward an apex of the layer as viewed. In this manner, a substrate lattice constant is effectively tuned from silicon at the interface to that of germanium at an apex of layer 320. In one embodiment, buffer layer 320 including a graded concentration of germanium (e.g., silicon germanium buffer layer) may be epitaxially grown on substrate 310.

Overlying or disposed on buffer layer 320 in structure 300 shown in FIG. 3 is blocking layer 330 of a blocking material. In one embodiment, blocking layer 330 includes a material having a wide bandgap. A wide bandgap material, in one embodiment, is a material having a bandgap of at least 1 eV. One suitable material for blocking layer 330 is a semiconductor material having a lattice structure similar to a lattice structure of buffer layer 320 at its interface with blocking layer 330. Where buffer layer 320 includes a high concentration of germanium at its apex, a wide bandgap semiconductor material for blocking layer 330 having a lattice structure similar to germanium is gallium arsenide (GaAs). In one embodiment, a material for blocking layer 330 has a suitable band offset to a material of a channel of a transistor device to be subsequently formed on blocking layer 330. For a germanium NMOS FET device (a germanium channel material), gallium arsenide is a suitable material because it has a conduction band offset of 0.3 eV from the germanium conduction band. In one embodiment, a wide bandgap semiconductor material such as gallium arsenide may be epitaxially grown on buffer layer 320. A thickness of blocking layer 330 is representatively on the order of 10 nm to 100 nm.

Overlying or disposed on blocking layer 330 in structure 300 of FIG. 3 is intrinsic layer 335. A representative material for intrinsic layer 335 is a semiconductor material that has a lattice structure similar to a lattice structure of blocking layer 330. One suitable material is germanium. In one embodiment, intrinsic layer 335 of germanium may be epitaxially grown or blocking layer 330.

FIG. 3 shows structure 300 after formation of shallow trench isolation (STI) 315 to define a device areas or regions in the structure (block 420, FIG. 8). A suitable material for STI 315 is silicon dioxide. In one embodiment, an opening is etched through blocking layer 330, buffer layer 320 and into substrate 310 around a device structure area. The opening is then filled with dielectric material to define the STI region. FIG. 3 illustrates structure 300 after a portion of intrinsic layer 335 is removed by a patterned process etch to define a fin of intrinsic layer 335 and portions of STI region 315 has been removed by, for example, an etch process (block 430, FIG. 8). A representative height of the exposed fin is representatively on the order of 500 angstroms (Å).

Figure 4:
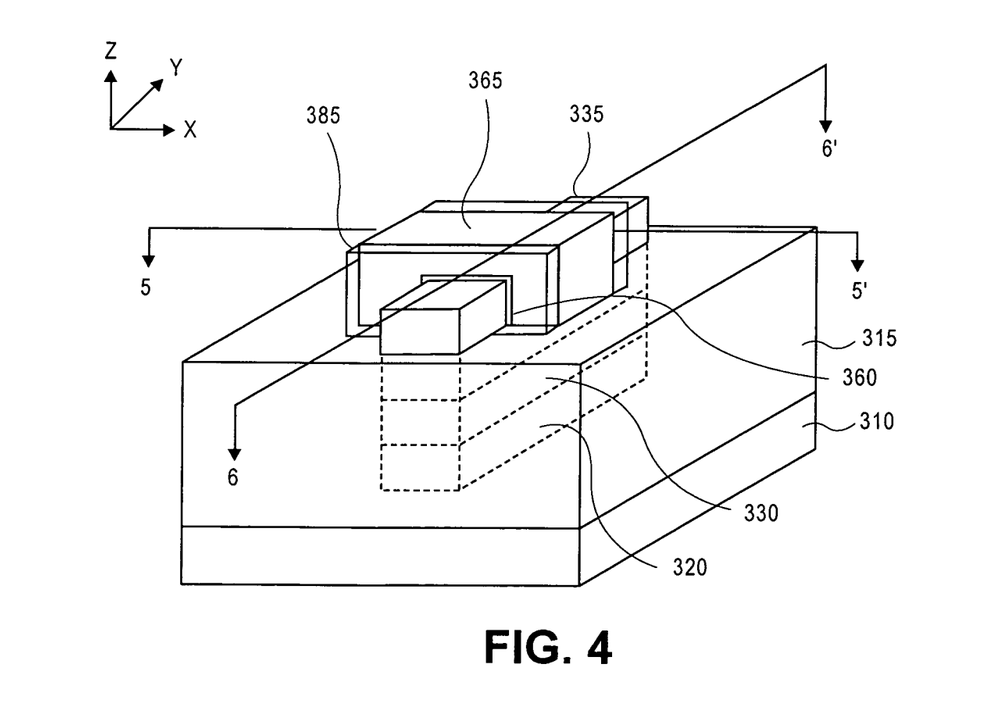
FIG. 4 shows a top side perspective view of the structure of FIG. 3 following the formation of a sacrificial or dummy gate stack on a fin portion of an intrinsic layer.

FIG. 4 shows a top side perspective view of the structure of FIG. 3 following the formation of a sacrificial or dummy gate stack on fin portion of intrinsic layer 335 extending above STI region 315 (block 440, FIG. 8). In one embodiment, a gate stack includes gate dielectric layer 360 of, for example, silicon dioxide or a high k dielectric material. Disposed on gate dielectric layer 360, in one embodiment, is dummy gate 365 of, for example, polysilicon deposited by, for example, a chemical vapor deposition method. In one embodiment, to form the gate stack, a mask material is introduced over the structure and patterned to have an opening for the gate stack. The gate stack is then introduced in the opening. The gate stack may include a spacer dielectric layer defining spacers 385 on opposite sides thereof.

Figure 5:
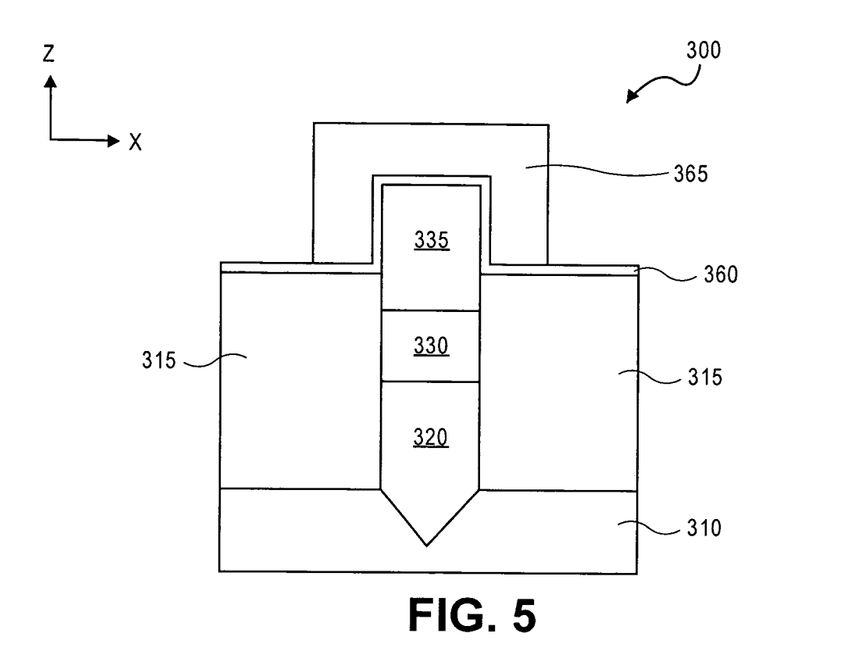
FIG. 5 shows the structure of FIG. 4 through line 5-5' showing the gate stack of the gate dielectric and dummy gate on the fin defined by the intrinsic layer.
Figure 6:
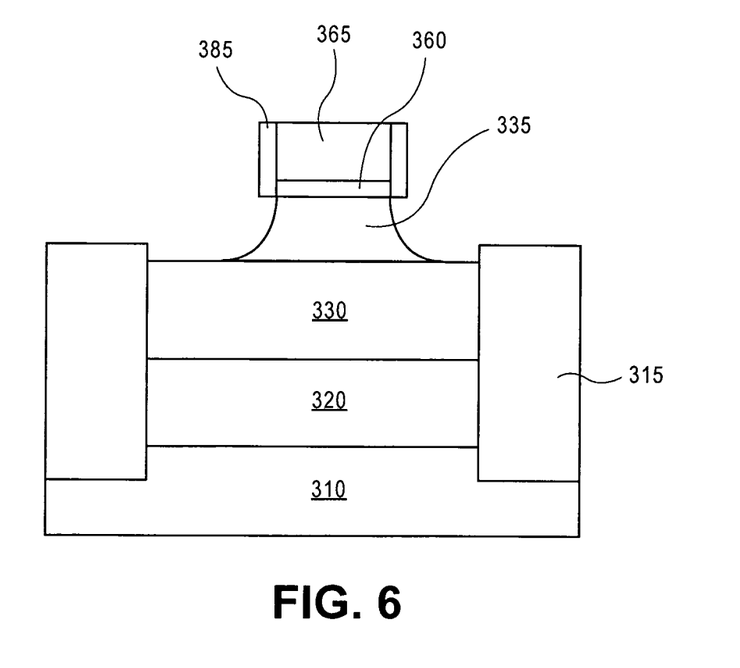
FIG. 6 shows a view of FIG. 5 through line 6-6' after removing portions of the intrinsic layer corresponding to source and drain regions in the fin.

FIG. 5 shows the structure of FIG. 4 through line 5-5' showing the gate stack of gate dielectric 360 and dummy gate 365 on the fin defined by intrinsic layer 335. FIG. 6 shows a view of FIG. 4 through line 6-6' after removing portions of intrinsic layer 335 corresponding to junction regions (source and drain) in the fin. Representatively, areas of the fin intrinsic layer 335 corresponding to the junction regions of the fin are exposed in dielectric layer 345 and an etch of the exposed areas is performed to remove intrinsic layer material leaving voids (block 450, FIG. 8). Source and drain material is then introduced into the voids.

Figure 7:
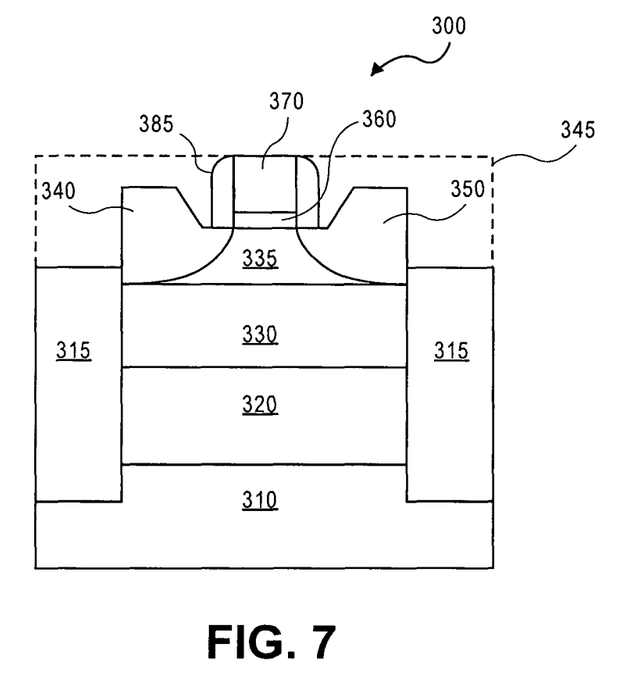
FIG. 7 shows the structure of FIG. 6 following the formation of a source and a drain of the device.
Figure 8:
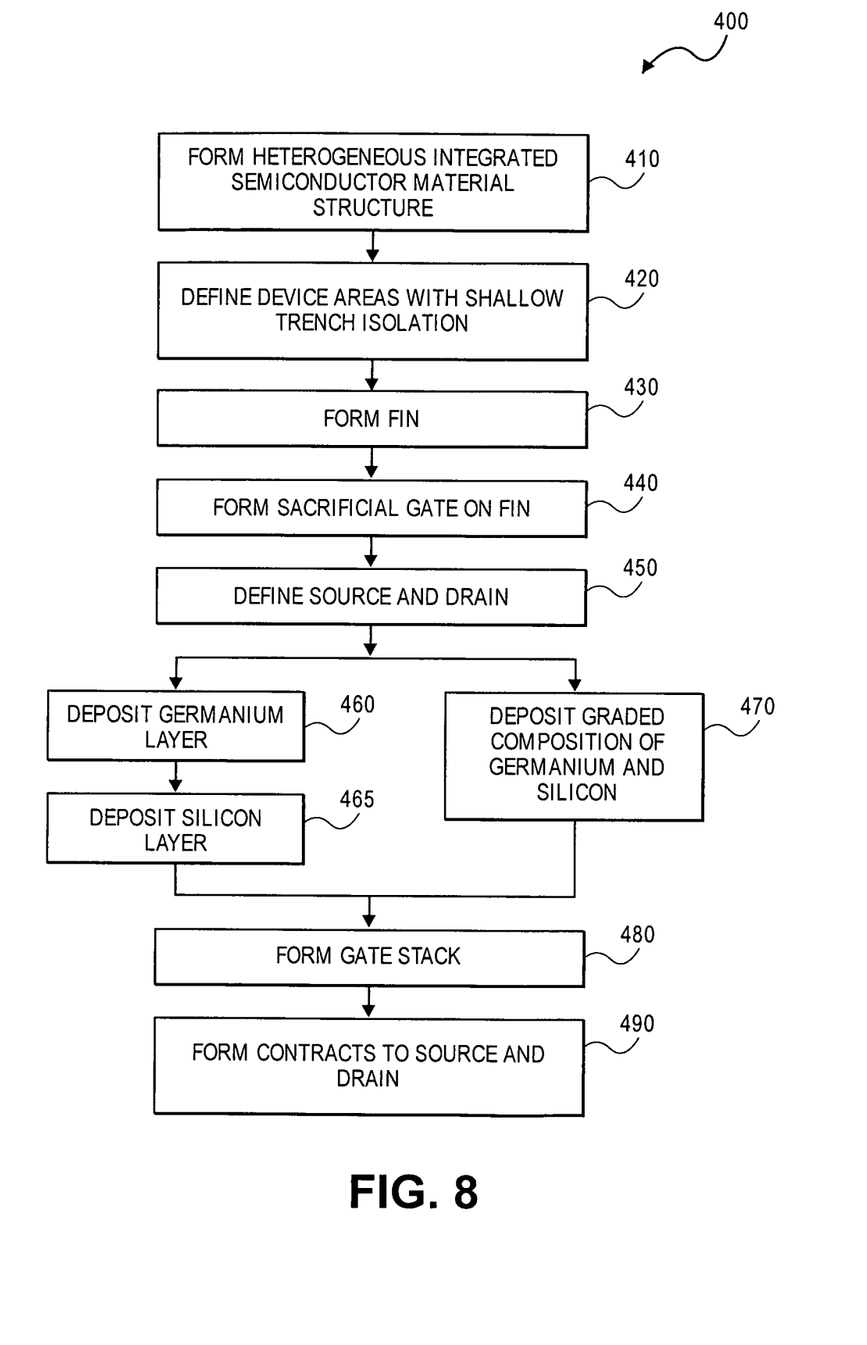
FIG. 8 presents a flow chart of an embodiment of a process of forming a three-dimensional transistor device with a multilayer or composite source and drain.

FIG. 7 shows the structure of FIG. 6 following the formation of a source and a drain of the device. Source 340 and drain 350 may be formed as described above with reference to FIG. 1 or FIG. 2 as multilayer or interfacial compositions of germanium and a material having a lower Schottky barrier relative to a conduction band of contact metal than germanium. In the example illustrated in FIG. 1, germanium may be initially introduced into the void for the source and drain to interface with blocking layer 330 and a portion of intrinsic layer 335 for a channel of the device (block 460, FIG. 8). Germanium may be introduced by an epitaxial growth or deposition method and doped with arsenic or phosphorous. Sufficient germanium is introduced to establish a desired physical property of source 340 and drain 350 and a channel of the device (e.g., a strain). Following the introduction of germanium, a material with a lower Schottky barrier relative to a conduction band of a contact metal than germanium is introduced (block 465, FIG. 8). An example is silicon that is introduced by an epitaxial growth or deposition method and doped with arsenic or phosphorous. For a graded composite composition for source and drain such as described with respect to FIG. 2, germanium and silicon may be introduced in a graded fashion to gradually transition the source and drain from 100 percent germanium at the interface with blocking layer 330 and an interface with intrinsic layer 335 to 0 percent germanium at an apex of source 340 and drain 350 where a metal contact will be connected to the source and drain, respectively (block 470, FIG. 8).

Following formation of junction regions 340 and 350, a dielectric material is introduced on the structure (on a surface including junction regions 340 and 350 and sacrificial gate 365). In one embodiment, the dielectric material is silicon dioxide or a low k material or a combination of materials (e.g., multiple low k materials or silicon dioxide and one or more low k materials). FIG. 7 shows dielectric material 345 in dashed lines. Sacrificial gate 365 and gate dielectric are then removed and replaced with a gate dielectric followed by a gate electrode such as a metal gate electrode (block 480, FIG. 8). Representative materials for a metal gate electrode include tungsten, tantalum, titanium or a nitride, a metal allow or another material. Following formation of gate electrode 370, contacts may be made to source 340 and drain 350 (and gate electrode 370) to form the device shown in FIG. 1 or FIG. 2 (block 490, FIG. 8).

Figure 9:
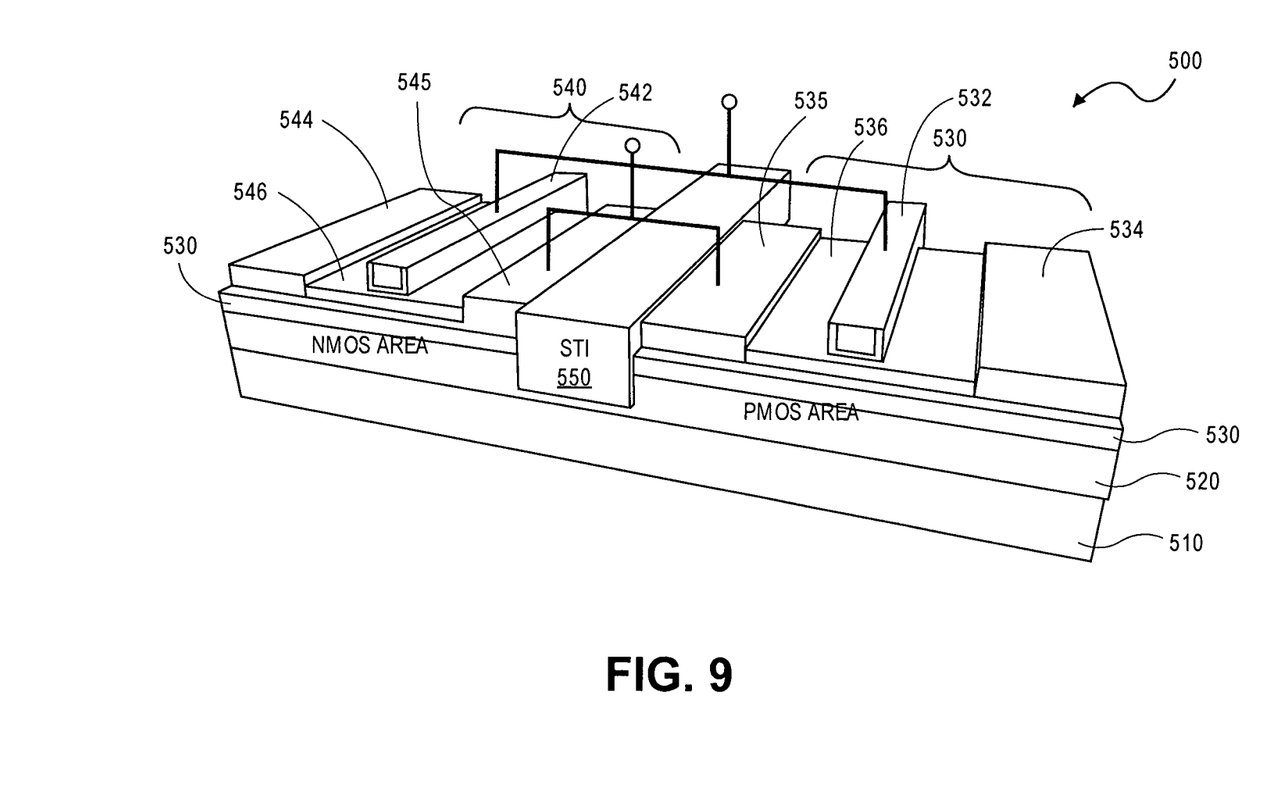
FIG. 9 shows a top side perspective schematic view of an embodiment of a CMOS inverter implement with planar transistor devices.

FIG. 9 shows a top, side perspective view of a CMOS inverter. Inverter 500 includes, in this embodiment, p-channel MOSFET 530 and n-channel MOSFET 540. Each of p-channel MOSFET 530 and n-channel MOSFET 540 is, in this embodiment, a planar device. It is appreciated that an inverter could also be formed using non-planar (e.g., multigate, nanowire) devices. In the embodiment illustrated in FIG. 9, each of p-channel MOSFET 530 and n-channel MOSFET 540 is formed on substrate 510. Substrate 510 is, for example, a single crystal silicon substrate or a silicon on insulator (SOI) substrate. Overlying silicon substrate 510 is buffer layer 520. Overlying buffer layer 520 is blocking layer 525 of, for example, GaAs. P-channel MOSFET 530 and n-channel MOSFET 540 are respectively formed on blocking layer 525 and separated by shallow trench isolation (STI) structure 550 of, for example, a dielectric material such as an oxide. P-channel MOSFET 530 includes gate electrode 532, source 534, drain 535 and channel 536 disposed between source 534 and drain 535 below gate electrode 532. Gate electrode 532 is separated from channel 536 by a gate dielectric disposed therebetween such as a dielectric material having a dielectric constant greater than silicon dioxide (a high K material): N-channel MOSFET 540 includes gate electrode 542, source 544, drain 545 and channel 546 disposed between source 544 and drain 545. Gate electrode 542 is separated from channel region by a gate dielectric disposed therebetween of, for example, a high K dielectric material. P-channel MOSFET 530 includes gate electrode 532, source region 534 and drain region 535 appropriately doped or constituting p-type material. In one embodiment, source 534 and drain 545 are a germanium material. N-channel MOSFET 540 includes gate electrode 542, source 544 and drain 545 appropriately doped or constituting n-type material. Source 544 and drain 545, in one embodiment, include a multilayer composition of germanium and silicon with germanium layer 544A/545A disposed at an interface with channel 546 and an interface with blocking layer 530 and silicon layer 544B and 545B on germanium layer 544A/545A. In another embodiment, source 544 and drain 545 of the n-channel MOSFET are each a graded composite composition of silicon and germanium with a germanium concentration of 100 percent of the composition at the interface with channel 546 and the interface with blocking layer 530 and a silicon concentration of 100 percent of the composition at an apex of the source and drain as viewed. CMOS inverter 500 is formed by the connection of drain region 535 of p-channel MOSFET 530 to drain region 545 of n-channel MOSFET 540 and the connection of each gate electrode as illustrated.

Figure 10:
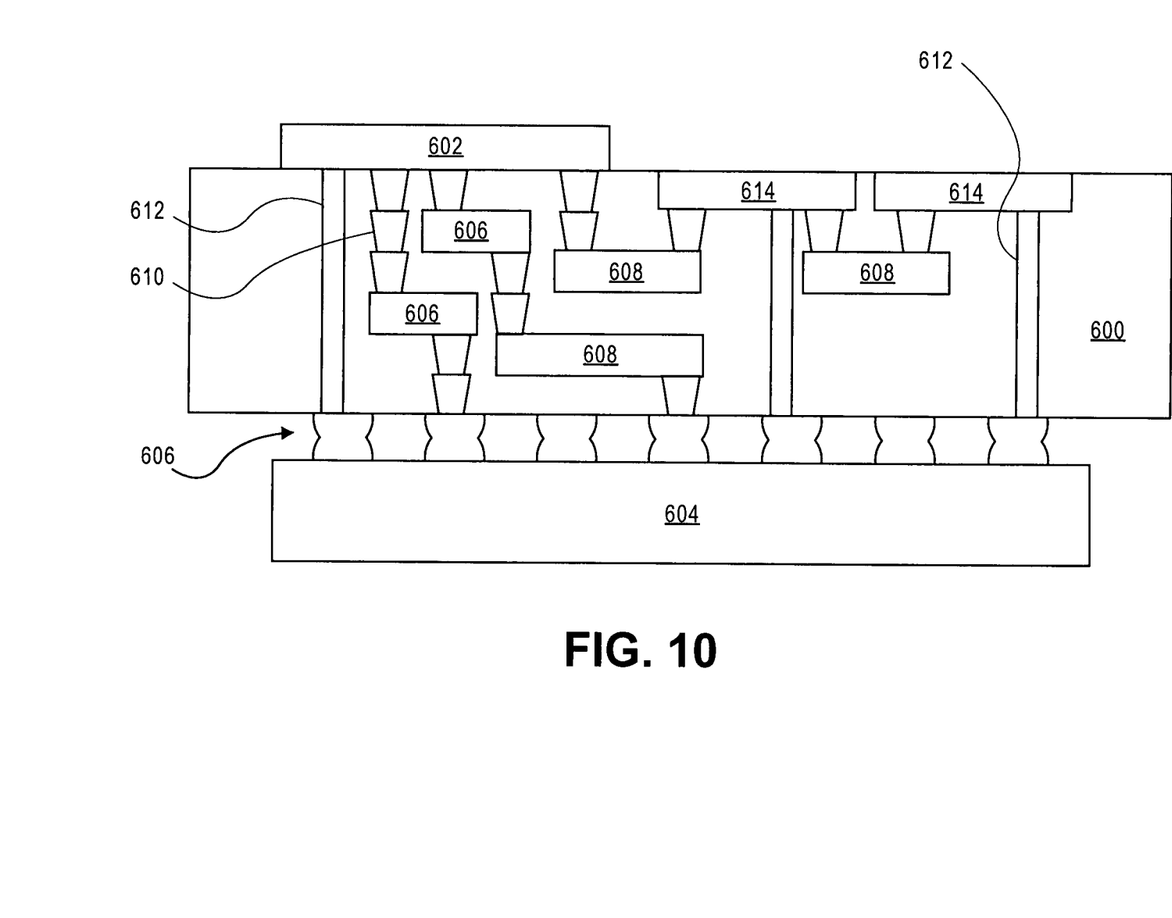
FIG. 10 is an interposer implementing one or more embodiments.

FIG. 10 illustrates interposer 600 that includes one or more embodiments. Interposer 600 is an intervening substrate used to bridge a first substrate 602 to second substrate 604. First substrate 602 may be, for instance, an integrated circuit die. Second substrate 604 may be, for instance, a memory module, a computer motherboard, or another integrated circuit die. Generally, the purpose of interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of interposer 600. In other embodiments, the first and second substrates 602/604 are attached to the same side of interposer 600. In further embodiments, three or more substrates are interconnected by way of interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 600.

In accordance with embodiments, apparatuses or processes disclosed herein may be used in the fabrication of interposer 600.

Figure 11:
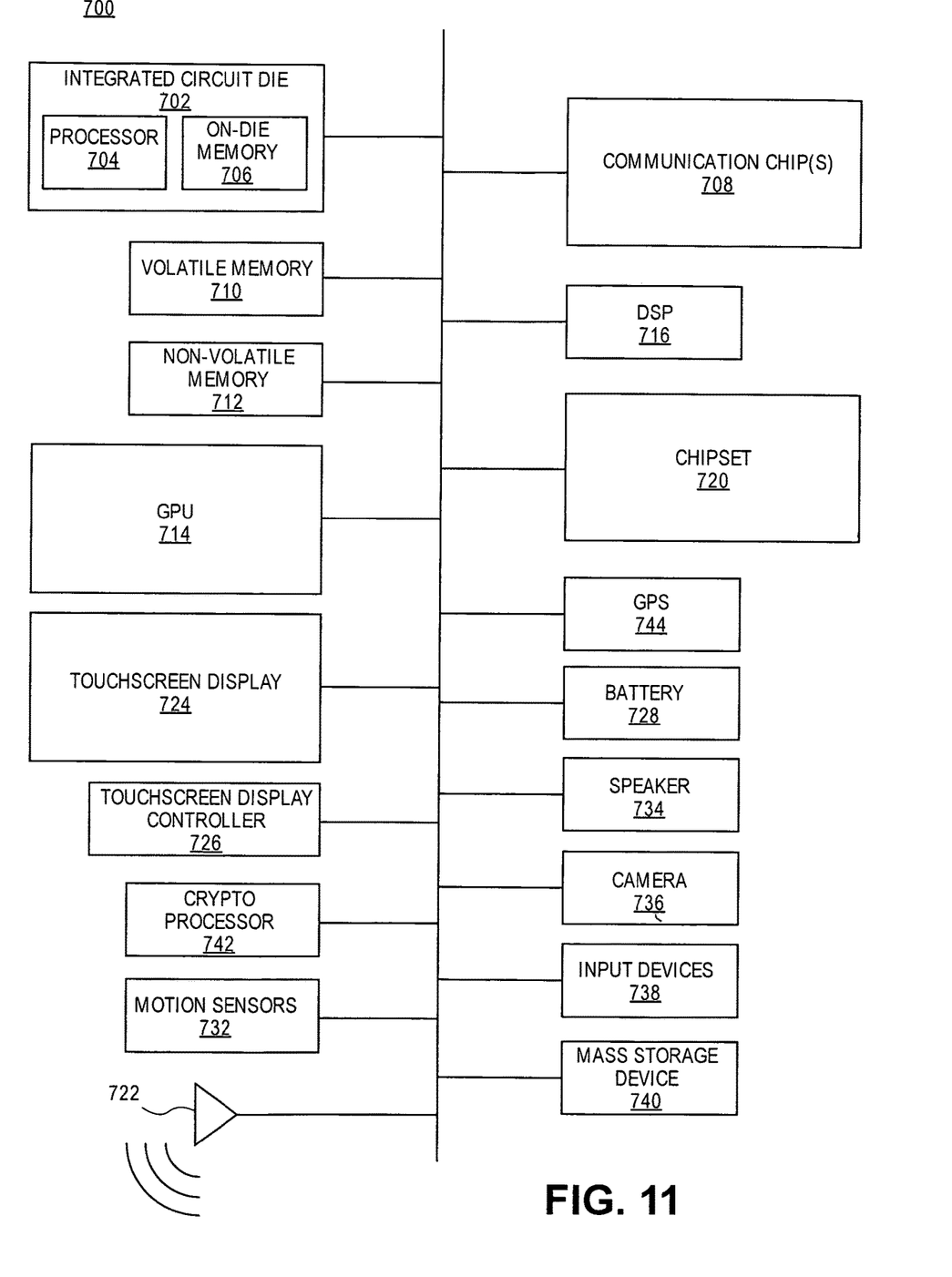
FIG. 11 illustrates an embodiment of a computing device.

FIG. 11 illustrates a computing device 700 in accordance with one embodiment. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a global positioning system (GPS) device 744, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The processor 704 of the computing device 700 includes one or more devices, such as transistors, that are formed in accordance with embodiments described above. The term "processor" may refer to any device or portion of a device that processes electronic data from registers and/or memory to transform that electronic data into other electronic data that may be stored in registers and/or memory.

The communication chip 708 may also include one or more devices, such as transistors, that are formed in accordance with embodiments.

In further embodiments, another component housed within the computing device 700 may contain one or more devices, such as transistors, that are formed in accordance with implementations.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

EXAMPLES

The following examples pertain to embodiments:

Example 1 is an apparatus including a substrate; a transistor device on the substrate including a channel disposed between a source and a drain; a source contact coupled to the source and a drain contact coupled to the drain; and the source and drain each including a composition including a concentration of germanium at an interface with the channel that is greater than a concentration of germanium at a junction with the source contact or the drain contact.

In Example 2, a concentration of germanium at the junction with the source contact or drain contact of the apparatus of Example 1 is zero percent.

In Example 3, a concentration of germanium of the apparatus of Example 2 is graded between the interface and the junction.

In Example 4, a concentration of germanium at the interface of the apparatus of Example 2 or 3 is 100 percent.

In Example 5, each of the source and the drain of the apparatus of any of Example 1 or 2 includes a multilayer composition including a first layer including germanium and a second layer including a material including a Schottky barrier relative to a conduction band of a material of the source contact and the drain contact that is lower than germanium.

In Example 6, the second layer of the apparatus of Example 5 includes silicon.

In Example 7, the transistor of the apparatus of any of Examples 1-6 includes an N-type transistor.

Example 8 is an apparatus including a transistor including an N-type channel disposed between a source and a drain, wherein the source and the drain include a first material including germanium and a second material; and a contact to one of the source and the drain, wherein the second material includes a Schottkey barrier relative to a conduction band of a material of the contact that is lower than a Schottkey barrier of germanium relative to the conduction band, and wherein at a junction between the contact and the one of the source and the drain, a concentration of the second material is greater than a concentration of the first material.

In Example 9, a concentration of the first material at the junction of the apparatus of Example 8 is zero percent.

In Example 10, the concentration of the first material of the apparatus of Example 9 is graded between an interface with the channel and the junction.

In Example 11, a concentration of the first material at the interface of the apparatus of Example 10 is 100 percent.

In Example 12, the source and the drain of the apparatus of Example 9 include a first layer including the first material and a second layer including the second material.

In Example 13, the second material of the apparatus of Example 8 includes silicon.

Example 14 is a method including defining an area on a substrate for a channel of a transistor device and a source and a drain of the transistor device; forming the source and the drain each including an interface with the channel; and forming a contact to one of the source and the drain, wherein a composition of each of the source and the drain includes a concentration of germanium at an interface with the channel that is greater than a concentration at a junction with the contact.

In Example 15, a concentration of germanium at the junction with the contact of the method of Example 14 is zero percent.

In Example 16, a concentration of germanium of the method of Example 15 is graded between the interface and the junction.

In Example 17, a concentration of germanium at the interface of the method of Example 15 is 100 percent.

In Example 18, forming the source and drain of the method of any of Example 14 or 15 includes a forming a multilayer composition including a first layer including germanium and a second layer including a second material including a Schottky barrier relative to a conduction band of a material of the contact that is lower than a Schottky barrier of germanium relative to the conduction band.

In Example 19, the first layer of the method of Example 18 is formed to interface with the channel.

In Example 20, the second material of the method of Example 18 includes silicon.

In Example 21, the method of Example 20 further includes doping the germanium and the second material, wherein doping includes doping the second material to a dopant concentration greater than a dopant concentration of the germanium.

In Example 22, a transistor device formed by the method of any of Example 14 or 15.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   a substrate;
   a transistor device on the substrate comprising:
   a channel disposed between a source and a drain;
   a source contact coupled to the source and a drain contact coupled to the drain; and
   the source and drain each comprising a composition comprising a concentration of germanium at an entirety of an interface with the channel that is greater than a concentration of germanium at a junction with the source and drain contacts, and the composition comprising a concentration of n-type dopants at the entirety of the interface with the channel that is less than a concentration of n-type dopants at the junction with the source and drain contacts.

2. The apparatus of claim 1, wherein a concentration of germanium at the junction with the contact is zero percent.

3. The apparatus of claim 2, wherein a concentration of germanium at the interface is 100 percent.

4. The apparatus of claim 1, wherein each of the source and the drain comprises a multilayer composition comprising a first layer comprising germanium and a second layer comprising a material comprising a Schottky barrier relative to a conduction band of a material of the source contact and the drain contact that is lower than germanium.

5. The apparatus of claim 4, wherein the second layer comprises silicon.

6. The apparatus of claim 1, wherein the transistor comprises an N-type transistor.

7. An apparatus comprising:
a transistor comprising an N-type channel disposed between a source and a drain, wherein the source and the drain comprise a first material comprising germanium and a second material; and
a contact to one of the source and the drain, wherein the second material comprises a Schottkey barrier relative to a conduction band of a material of the contact that is lower than a Schottkey barrier of germanium relative to the conduction band, and wherein at a junction between the contact and the one of the source and the drain, a concentration of the second material is greater than a concentration of the first material, and wherein a concentration of the first material at an entirety of an interface with the N-type channel that is greater than a concentration of the first material at the junction between the contact and the one of the source and the drain, and wherein the one of the source or drain comprises a concentration of n-type dopants at the entirety of the interface with the N-type channel that is less than a concentration of n-type dopants at the junction with the contact.

8. The apparatus of claim 7, wherein a concentration of the first material at the junction is zero percent.

9. The apparatus of claim 7, wherein a concentration of the first material at the interface is 100 percent.

10. The apparatus of claim 8, wherein the source and the drain comprise a first layer comprising the first material and a second layer comprising the second material.

11. The apparatus of claim 7, wherein the second material comprises silicon.

12. A method comprising:
defining an area on a substrate for a channel of a transistor device and a source and a drain of the transistor device;
forming the source and the drain each comprising an interface with the channel; and
forming a contact to one of the source and the drain, wherein a composition of each of the source and the drain comprises a concentration of germanium at an entirety of an interface with the channel that is greater than a concentration at a junction with the contact, and the composition comprises a concentration of n-type dopants at the entirety of the interface with the channel that is less than a concentration of n-type dopants at the junction with the contact.

13. The method of claim 12, wherein a concentration of germanium at the junction with the contact is zero percent.

14. The method of claim 13, wherein a concentration of germanium at the interface is 100 percent.

15. The method of claim 12, wherein forming the source and drain comprises a forming a multilayer composition comprising a first layer comprising germanium and a second layer comprising a second material comprising a Schottky barrier relative to a conduction band of a material of the contact that is lower than a Schottky barrier of germanium relative to the conduction band.

16. The method of claim 15, wherein the first layer is formed to interface with the channel.

17. The method of claim 15, wherein the second material comprises silicon.

* * * * *